US 11,060,916 B2

United States Patent
Zhang et al.

(10) Patent No.: US 11,060,916 B2
(45) Date of Patent: Jul. 13, 2021

(54) ADJUSTABLE HYPERSPECTRAL DETECTION CHIP ENHANCED BY MULTI-RESONANCE PLASMONIC MECHANISM

(71) Applicant: Southeast University, Jiangsu (CN)

(72) Inventors: Tong Zhang, Jiangsu (CN); Dan Su, Jiangsu (CN); Meng Xiong, Jiangsu (CN); Feng Shan, Jiangsu (CN); Xiaoyang Zhang, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 16/975,400

(22) PCT Filed: May 28, 2018

(86) PCT No.: PCT/CN2018/088736
§ 371 (c)(1),
(2) Date: Aug. 25, 2020

(87) PCT Pub. No.: WO2019/165713
PCT Pub. Date: Sep. 6, 2019

(65) Prior Publication Data
US 2021/0033462 A1 Feb. 4, 2021

(30) Foreign Application Priority Data
Mar. 1, 2018 (CN) .......................... 201810171259.0

(51) Int. Cl.
*G01J 3/447* (2006.01)
*G01J 3/28* (2006.01)
(Continued)

(52) U.S. Cl.
CPC ............. *G01J 3/447* (2013.01); *G01J 3/2823* (2013.01); *H01L 27/14625* (2013.01);
(Continued)

(58) Field of Classification Search
CPC .. G01J 3/447; G01J 3/2823; G01J 2003/2826; H01L 27/14625;
(Continued)

(56) References Cited

U.S. PATENT DOCUMENTS

| 6,040,936 A * | 3/2000 | Kim ...................... G02B 5/008 |
| | | 359/245 |
| 8,183,772 B2 * | 5/2012 | Ray ......................... G09G 3/30 |
| | | 313/512 |

(Continued)

FOREIGN PATENT DOCUMENTS

| CN | 102901715 | 1/2013 |
| CN | 103558206 | 2/2014 |

(Continued)

OTHER PUBLICATIONS

"International Search Report (Form PCT/ISA/210) of PCT/CN2018/088736", dated Nov. 5, 2018, with English translation thereof, pp. 1-4.

*Primary Examiner* — Mohamed K Amara
(74) *Attorney, Agent, or Firm* — JCIP Global Inc.

(57) ABSTRACT

An adjustable hyperspectral detection chip enhanced by a multi-resonance plasmonic mechanism. The detection chip consists of an array of metal nanonail resonator detection units. Each detection unit (1) comprises: a bottom electrode (2), a semiconductor material layer (3), a spacer layer (4), a nanonail array (5), a control material layer (6), a top electrode (7), a peripheral control signal (8), and a driving circuit (9). The positional relationship from top to bottom is the top electrode (7), the control material layer (6), the nanonail array (5), the spacer layer (4), the semiconductor material layer (3), and the bottom electrode (2). The nanonail array (5) is loaded inside the control material layer (6), and the (Continued)

peripheral control signal (8) and the driving circuit (9) are connected to both sides of the control material layer (6).

10 Claims, 3 Drawing Sheets

(51) Int. Cl.
  *H01L 27/146* (2006.01)
  *H01L 31/0232* (2014.01)
  *H01L 31/0352* (2006.01)
  *H01L 31/101* (2006.01)

(52) U.S. Cl.
  CPC .... *H01L 31/02327* (2013.01); *H01L 31/0352* (2013.01); *H01L 31/1013* (2013.01); *G01J 2003/2826* (2013.01)

(58) Field of Classification Search
  CPC ........... H01L 31/02327; H01L 31/1013; H01L 31/0352; H01L 27/1443; H01L 27/1446; H01L 31/035218; H01L 31/09
  See application file for complete search history.

(56) References Cited

U.S. PATENT DOCUMENTS

| | | | | |
|---|---|---|---|---|
| 8,536,667 | B2* | 9/2013 | de Graff | A61B 5/6847 257/419 |
| 9,159,635 | B2* | 10/2015 | Elolampi | H05K 3/4644 |
| 9,184,410 | B2* | 11/2015 | Visser | H01L 51/5234 |
| 9,765,934 | B2* | 9/2017 | Rogers | H01L 24/24 |
| 10,446,700 | B2* | 10/2019 | Wang | H04B 10/40 |
| 2003/0096113 | A1* | 5/2003 | Jacobson | C09D 11/50 428/379 |
| 2004/0086423 | A1* | 5/2004 | Wohlstadter | G01N 21/66 422/52 |
| 2005/0230822 | A1* | 10/2005 | Tran | G11C 13/04 257/735 |
| 2005/0285128 | A1* | 12/2005 | Scherer | H01L 33/38 257/98 |
| 2010/0126567 | A1* | 5/2010 | Kaufman | H01L 31/035227 136/252 |
| 2011/0109854 | A1* | 5/2011 | Tang | G02F 1/195 349/117 |
| 2011/0116168 | A1* | 5/2011 | Nikoobakht | G02B 5/22 359/585 |
| 2011/0166045 | A1* | 7/2011 | Dhawan | G01N 21/554 506/39 |
| 2011/0285942 | A1* | 11/2011 | Guo | G02B 5/288 349/96 |
| 2012/0064134 | A1* | 3/2012 | Bourke, Jr. | A61K 8/23 424/401 |
| 2012/0132930 | A1* | 5/2012 | Young | H01L 31/0481 257/84 |
| 2012/0164433 | A1* | 6/2012 | Advincula | B82Y 30/00 428/327 |
| 2012/0265596 | A1* | 10/2012 | Mazed | G06Q 20/384 705/14.23 |
| 2012/0313129 | A1* | 12/2012 | Zettsu | H01L 51/5048 257/98 |
| 2013/0081693 | A1* | 4/2013 | Kaufman | H01L 31/055 136/257 |
| 2013/0118906 | A1* | 5/2013 | Cronin | C25B 11/051 205/340 |
| 2013/0140649 | A1* | 6/2013 | Rogers | H01L 29/66007 257/414 |
| 2013/0153860 | A1* | 6/2013 | Kim | C01B 32/186 257/14 |
| 2013/0327928 | A1* | 12/2013 | Leach | B82Y 20/00 250/216 |
| 2014/0061486 | A1* | 3/2014 | Bao | G02B 1/02 250/370.01 |
| 2014/0159011 | A1* | 6/2014 | Suzuki | C07D 209/86 257/40 |
| 2014/0168742 | A1* | 6/2014 | Hashimura | G02F 1/0018 359/245 |
| 2014/0224989 | A1* | 8/2014 | Long | G02F 1/0126 250/338.4 |
| 2015/0099321 | A1* | 4/2015 | Tsung | H01L 33/44 438/29 |
| 2016/0004298 | A1* | 1/2016 | Mazed | G06K 9/00268 345/633 |
| 2016/0139476 | A1* | 5/2016 | Garcia | G02F 1/163 359/275 |
| 2016/0258069 | A1* | 9/2016 | Nesbitt | H01L 31/0352 |
| 2016/0307939 | A1* | 10/2016 | Wang | H04B 10/6971 |
| 2017/0018688 | A1* | 1/2017 | Mazed | G06F 3/011 |
| 2017/0023803 | A1* | 1/2017 | Han | G02F 1/0102 |
| 2017/0061904 | A1* | 3/2017 | Lin | G09G 3/36 |
| 2017/0084764 | A1* | 3/2017 | Lu | H01L 31/035218 |
| 2017/0221032 | A1* | 8/2017 | Mazed | G06Q 30/0639 |
| 2017/0221596 | A1* | 8/2017 | Caldwell | G01J 5/0896 |
| 2017/0316487 | A1* | 11/2017 | Mazed | G06Q 30/02 |
| 2018/0023124 | A1* | 1/2018 | Collins | C12Q 1/6827 435/6.11 |
| 2018/0031549 | A1* | 2/2018 | Chen | G01N 33/54346 |
| 2018/0045861 | A1* | 2/2018 | Caldwell | H01L 28/24 |
| 2018/0045953 | A1* | 2/2018 | Fan | G02B 5/18 |
| 2018/0165823 | A1* | 6/2018 | Ludwig | H01L 27/288 |
| 2018/0202928 | A1* | 7/2018 | Abdulhalim | G01N 21/4788 |
| 2018/0217138 | A1* | 8/2018 | Han | G01N 21/554 |
| 2019/0189840 | A1* | 6/2019 | Tsai | H01S 5/1067 |

FOREIGN PATENT DOCUMENTS

| | | |
|---|---|---|
| CN | 105810704 | 7/2016 |
| CN | 105926042 | 9/2016 |
| JP | 2002368949 | 12/2002 |

* cited by examiner

ADJUSTABLE HYPERSPECTRAL DETECTION CHIP ENHANCED BY MULTI-RESONANCE PLASMONIC MECHANISM

CROSS-REFERENCE TO RELATED APPLICATION

This application is a continuation of international PCT application serial no. PCT/CN2018/088736, filed on May 25, 2018, which claims the priority benefit of Chinese application no. 201810171259.0, filed on Mar. 1, 2018. The entirety of each of the above-mentioned patent applications is hereby incorporated by reference herein and made a part of this specification.

BACKGROUND

Technical Field

The present invention belongs to the fields such as the field of infrared detectors and the field of metal nanomaterials, and specifically, to an adjustable hyperspectral detection chip enhanced by a multi-resonance plasmonic mechanism.

Description of Related Art

In the hyperspectral imaging detection technology, a hyperspectral image with specific spectral resolution is used for target detection. Compared with the conventional single-wide band optoelectronic detection technology, the hyperspectral imaging detection technology requires a combination of the imaging technology and spectral measurement technology to obtain two-dimensional spatial information and spectral radiation information with distribution of wavelengths. Only by implementing high-precision resolution of target spectral information and a target space image, can accuracy of target detection be improved, functions of conventional detection technologies be expanded, and application requirements be satisfied in fields of target detection technologies such as target material recognition, abnormal target detection, camouflage target identification, and complex background suppression. However, detection wavelengths of the existing conventional infrared photodetectors are limited by a band gap of a semiconductor material and a longer band cannot be detected. In addition, a photodetector usually performs light spitting on infrared radiation by using discrete devices such as a prism, a grating, or distributed Bragg reflectors, to achieve infrared multi-spectral imaging, but it is difficult to achieve chipization and integration. In addition, the existing multi-spectral detection technology uses fewer working bands, generally 10-20 working bands, and spectral resolution $\Delta\lambda/\lambda$ is approximately 0.1, that is, the spectral resolution is low.

In the present invention, an adjustable hyperspectral detection chip enhanced by a multi-resonance plasmonic mechanism is provided by using a localized plasmonic effect of a plasmonic nanoparticle to address bottleneck problems, such as low the quantum efficiency, low spectral resolution, and inability to achieve integration and chipization by using discrete devices, in existing infrared photodetectors with reference to a new mechanism and a new technology. In addition, a bottleneck that a detection wavelength of a conventional semiconductor detector is limited by a band gap thereof can be broken through by using plasmon-induced hot carriers, and a detection wavelength range is expanded. The detection chip has advantages such as an extendable detection band, high the quantum efficiency, high spectral resolution, chipization, integration, and low costs and can be widely applied to the fields such as military reconnaissance, target/background detection, and landmine detection.

SUMMARY

Technical Problem: An objective of the present invention is to resolve the technical problems of existing infrared photodetectors such as that a detection wavelength is limited by a semiconductor band gap, a detection range is limited, the quantum efficiency is low, spectral resolution is low, and it is difficult to achieve integration and large-scale chipization by using discrete devices, and provide an adjustable hyperspectral detection chip enhanced by a multi-resonance plasmonic mechanism. A heterojunction is formed by using a metal nanonail and a semiconductor to achieve optical detection that breaks through the cut-off wavelength of the semiconductor based on plasmonic resonance enhanced hot carrier effect. Narrowing of the bandwidth of the optical absorption spectrum caused by competition between two, horizontal and vertical, resonance modes of the metal nanonail is utilized, and when the metal nanonail is added to the infrared photodetector, local light intensity density of light incident on a detection material can be increased to significantly improve the quantum efficiency of the detector material. A plasmonic resonance using plasmonic nanoparticles is related to a refractive index of a surrounding medium. Nanonails are loaded inside the control material layer, and a distribution state of the control material layer is changed by using a external control signal, and the refractive index of the medium surrounding the nanonails is changed, to achieve real-time control of the peak position of a detector response spectral band, and spectral resolution is better than 1 nanometer. The detection chip has advantages such as an extendable detection wavelength, high the quantum efficiency, high spectral resolution, integration, low costs, and a simple fabrication process, and can be used to fabricate an arrayed hyperspectral detector.

Technical Solution: To resolve the foregoing technical problems, the present invention provides an adjustable hyperspectral detection chip enhanced by a multi-resonance plasmonic mechanism, including an array of metal nanonail resonator detection units. Each detection unit includes: a bottom electrode, a semiconductor material layer, a spacer layer, a nanonail array, a control material layer, a top electrode, a peripheral control signal, and a driving circuit. The positional relationship from top to bottom is the top electrode, the control material layer, the nanonail array, the spacer layer, the semiconductor material layer, and the bottom electrode. The nanonail array is loaded inside the control material layer, and the peripheral control signal and the driving circuit are connected to both sides of the control material layer.

The size of the detection unit ranges from 200 nanometers to 4 microns, a distance between adjacent detection units ranges from 500 nanometers to 2 microns, the array of detection units is a k×t two-dimensional area array, where values of k and t are set to 2-10000, and the size of the formed detection chip ranges from 100-5000 microns.

The bottom electrode is a multi-layer electrode, layers of electrodes are insulated from each other, and each layer of electrode cooperates with the top electrode to independently read out an electrical signal.

The bottom electrode and the top electrode are transparent materials with a thickness ranging from 50-300 nanometers; the materials for the bottom electrode and the top electrode are selected from gold, silver, copper, aluminum, titanium, a nickel metal electrode material or indium tin oxide (ITO), aluminum doped Zinc oxide (AZO), fluorine-doped tin oxide (FTO), and a graphene semiconductor transparent conductive material. A number of layers of the bottom electrode is m+n, where a value of m is set to a number of arrangement directions of nanonails in the detection unit, and a value of n is set to a number of size types of the nanonails in the same detection unit.

The material for the semiconductor material layer is selected from n-type silicon, n-type gallium arsenide, indium phosphide (InP), gallium antimonide (GaSb), or cadmium zinc telluride (CdZnTe), and the thickness of the semiconductor material layer ranges from 1-500 microns.

The material of the spacer layer includes silicon dioxide or aluminum oxide.

The nanonail array is formed by structures of plasmonic nanonails with a multi-resonance enhancement effect arranged periodically, and the plasmonic nanonail with the multi-resonance enhancement effect includes two parts: a triangular nanoplate and a nanorod, and the plasmonic nanonail with the multi-resonance enhancement effect has characteristics of infrared ultra-narrow band absorption, strong short-range dielectric sensitivity, and strong polarization selectivity.

The nanonail array includes 2-10 plasmonic nanonails with the multi-resonance enhancement effect, the size of the nanonail ranges from 20-1000 nanometers, and a spacing between the nanonails ranges from 10-1000 nanometers.

The material for the plasmonic nanonail with the multi-resonance enhancement effect is selected from gold, silver, copper, palladium, rhodium, or semiconductor alloy plasmonic materials; and the nanonail structures separately correspond to a localized surface plasmon resonance peak formed by a triangular nanoplate and a plasmonic Fabry-Perot resonance peak formed by a nanorod at the same wavelength, that is, the plasmonic multi-resonance enhancement effect exists.

The control material layer may be an electro-optical material, an acousto-optic material, a piezo-optic material, or a material with a controllable refractive index.

The detection chip can implement multi-function monolithic integration of hyperspectral detection, polarization detection, and diffraction limit breakthrough detection. A driving method of the device is as follows: when light is irradiated on the detection unit, carriers cross the Schottky barrier to form a photocurrent by using a heterojunction between the semiconductor material layer and the nanonail array based on a plasmon-induced hot carrier effect. External control signals with a time period of 5 ms to 60 s are applied through the driving circuit to both sides of the control material layer, to change a distribution state of the control material layer, thereby changing a refractive index of the medium surrounding the nanonail array, and scanning a central wavelength of ultra-narrow band absorption of light by the nanonails. Output signals of the top electrode and the bottom electrode of the detector array are collected every 0.01-5 ms in the same period for imaging, thereby implementing a hyperspectral imaging function. By utilizing polarization selectivity of the plasmonic nanonail with the multi-resonance enhancement effect on a direction of incident light, each detection unit has 2-8 different arrangement directions and nanonail structures of 2-4 different sizes. The top electrode is connected to a bottom electrode corresponding to a nanonail structure with the same arrangement direction, to independently read out different polarized-light response currents. The top electrode is connected to a bottom electrode corresponding to a nanonail structure with the same size, to broaden different response bands. In addition, sizes of the plasmonic nanonails with the multi-resonance enhancement effect are all less than the detection wavelength, so that a diffraction limit breakthrough detection function can be implemented.

Advantageous Effect: Compared with the prior art, the present invention has the following advantages:

1. An adjustable hyperspectral detection chip enhanced by a multi-resonance plasmonic mechanism is provided. By utilizing characteristics of ultra-narrow band infrared light absorption, polarization selection, and sub-wavelength light control of a plasmonic nanonail structure with a multi-resonance enhancement effect, multi-function monolithic integration of hyperspectral detection, polarization detection, and diffraction limit breakthrough detection is implemented, and a problem that a conventional infrared photodetector performs light splitting and polarization selection by using discrete devices, and cannot implement integration of a high-performance detection system is overcome.

2. An adjustable hyperspectral detection chip enhanced by a multi-resonance plasmonic mechanism is provided. By utilizing strong ultra-narrow band absorption of a plasmonic nanonail structure with a multi-resonance enhancement effect and strong sensitivity of a resonance peak thereof to a short-range dielectric environment, hyperspectral detection of an infrared band photo-induced hot carrier mechanism is implemented, so that a problem that spectral resolution of an existing infrared optoelectronic detection chip is low can be overcome, and spectral resolution is better than 1 nanometer.

3. An adjustable hyperspectral detection chip enhanced by a multi-resonance plasmonic mechanism is provided. By utilizing a mechanism of competition between two, horizontal and vertical, resonance modes of a nanonail, the bandwidth of the optical absorption spectrum of an infrared detection chip is greatly narrowed, and after a metal nanonail multi-resonance plasmonic structure is added to an infrared photodetector, local light intensity density of light incident on a detection material can be increased by 2-4 orders of magnitude to significantly improve the quantum efficiency of the detector.

DESCRIPTION OF THE EMBODIMENTS

Figure 1:
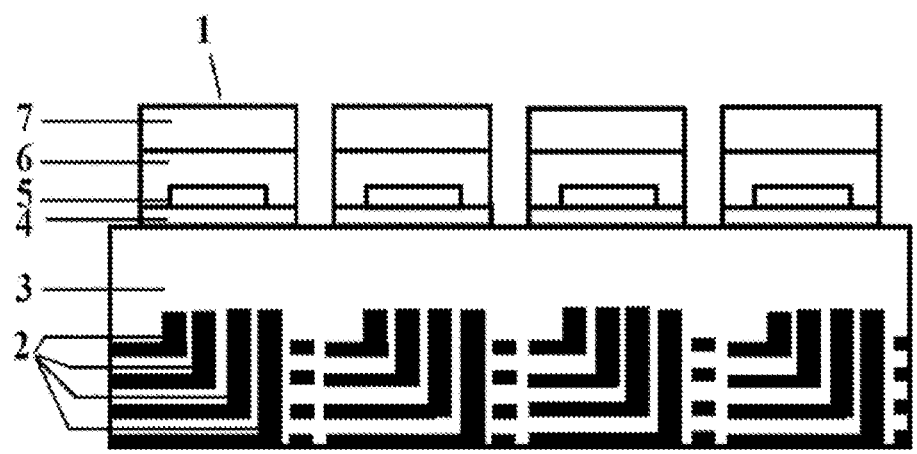
FIG. 1 is a schematic structural diagram of an adjustable hyperspectral detection chip enhanced by a multi-resonance plasmonic mechanism.
Figure 2:
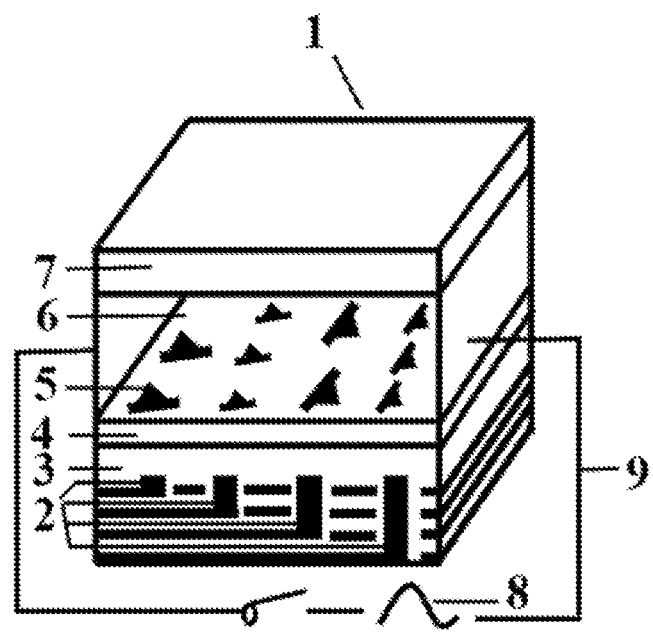
FIG. 2 is a schematic structural diagram of a detection unit 1 of an adjustable hyperspectral detection chip enhanced by a multi-resonance plasmonic mechanism, where in the figure, there are a bottom electrode 2, a semiconductor material layer 3, a spacer layer 4, a nanonail array 5, a control material layer 6, a top electrode 7, a peripheral control signal 8, and a driving circuit 9.
Figure 3:
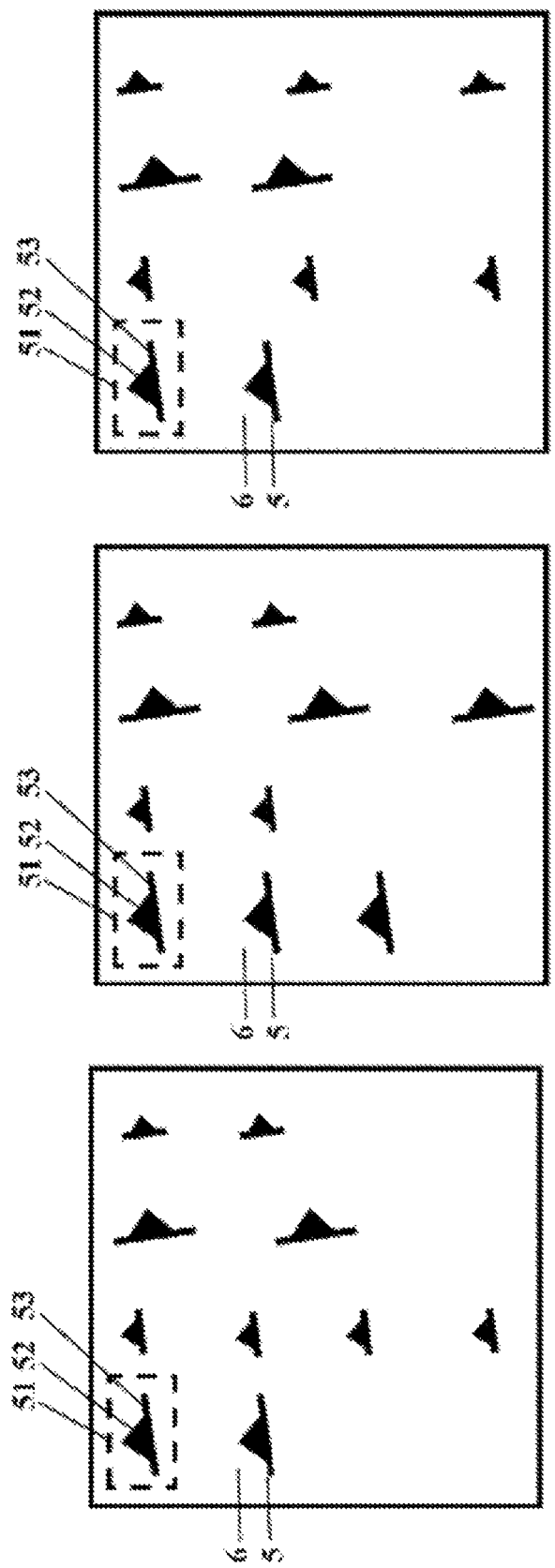
FIG. 3 is a top view of a detection unit 1 of an adjustable hyperspectral detection chip enhanced by a multi-resonance plasmonic mechanism, where a nanonail array 5 in the detection unit 1 includes a plasmonic nanonail structure 51 with a multi-resonance enhancement effect that has two arrangement directions and two sizes. In the figure, there are a control material layer 6, the nanonail array 5, and the plasmonic nanonail structure 51 with a multi-resonance enhancement effect.
Figure 4:
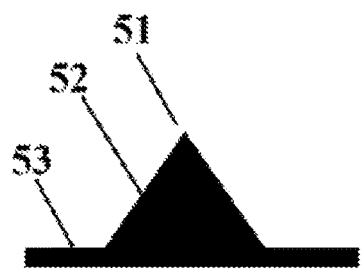
FIG. 4 is a schematic structural diagram of a nanonail 51, where in the figure, a plasmonic nanonail structure 5 with a multi-resonance enhancement effect includes two parts a triangular nanoplate 52 and a nanorod 53. The triangular nanoplate 52 and nanorod 53 may be the same metal nanomaterial, or may be two different metal nanomaterials.
Figure 5:
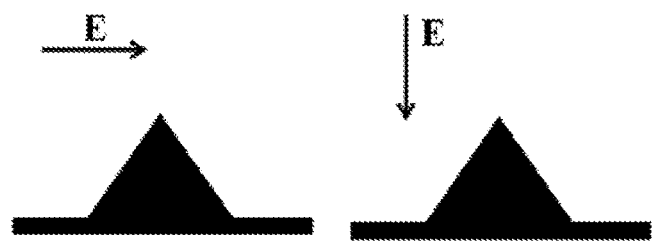
FIG. 5 is a schematic diagram of polarization selectivity of a structure of a plasmonic nanonail 51 with a multi-resonance enhancement effect.
Figure 6:
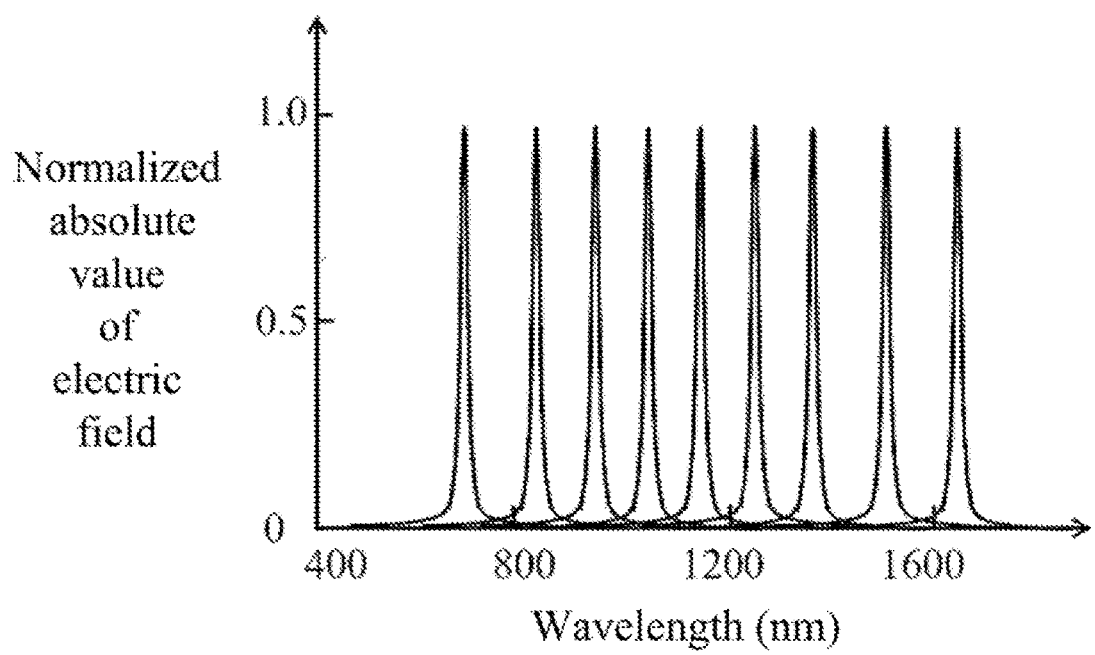
FIG. 6 is a schematic diagram of a relationship between normalized electric field intensity of a structure of a plasmonic nanonail 51 with a multi-resonance enhancement effect and an incident wavelength.

The present invention provides an adjustable hyperspectral detection chip enhanced by a multi-resonance plasmonic mechanism, including an array of metal nanonail resonator detection units. Each detection unit 1 includes: a bottom electrode 2, a semiconductor material layer 3, a spacer layer 4, a nanonail array 5, a control material layer 6, a top electrode 7, a peripheral control signal 8, and a driving circuit 9. The positional relationship from top to bottom is the top electrode 7, the control material layer 6, the nanonail array 5, the spacer layer 4, the semiconductor material layer 3, and the bottom electrode 2. The nanonail array 5 is loaded inside the control material layer 6.

The nanonail array 5 is formed by plasmonic nanonails 51 with a multi-resonance enhancement effect arranged periodically, and the plasmonic nanonail 51 with the multi-resonance enhancement effect includes two parts: a triangular nanoplate 52 and a nanorod 53, and the plasmonic nanonail 51 with the multi-resonance enhancement effect has characteristics such as infrared ultra-narrow band absorption, strong short-range dielectric sensitivity, and strong polarization selectivity. The driving circuit 9 is connected to both sides of the control material layer 6. The bottom electrode 2 is a multi-layer electrode, layers of electrodes are insulated from each other, and each layer of electrode cooperates with the top electrode 7 to independently read out an electrical signal.

The detection chip can implement multi-function monolithic integration of hyperspectral detection, polarization detection, and diffraction limit breakthrough detection. A driving method of the device is as follows: when light is irradiated on the detection unit 1, carriers cross the Schottky barrier to form a photocurrent by using a heterojunction between the semiconductor material layer 3 and the nanonail array 5 based on a plasmon-induced hot carrier effect. External control signals 8 with a time period of 5 ms to 60 s are applied through the driving circuit 9 to both sides of the control material layer 6, to change a distribution state of the control material layer 6, thereby changing a refractive index of the medium surrounding the nanonail array 5, and scanning a central wavelength of ultra-narrow band absorption of light by the nanonails. Output signals of the top electrode 7 and the bottom electrode 2 of the detector array are collected every 0.01-5 ms in the same period for imaging, thereby implementing a hyperspectral imaging function. By utilizing polarization selectivity of the nanonail 51 on a direction of incident light, each detection unit has 2-8 different arrangement directions and nanonail structures of 2-4 different sizes. The top electrode 7 is connected to a bottom electrode corresponding to a nanonail structure with the same arrangement direction, to independently read out different polarized-light response currents. The top electrode 7 is connected to a bottom electrode 2 corresponding to a nanonail structure with the same size, to broaden different response bands. In addition, sizes of the nanonails 51 are all less than the detection wavelength, so that a diffraction limit breakthrough detection function can be implemented.

The present invention provides an adjustable hyperspectral detection chip enhanced by a multi-resonance plasmonic mechanism.

First, by utilizing infrared ultra-narrowband absorption of a plasmonic nanonail structure having an effect of competition between two, horizontal and vertical, resonance modes, local light intensity density of light incident on a detection material is increased by 2-4 orders of magnitude to significantly improve the quantum efficiency of the detector material by using a Purcell effect (a magnitude of the quantum efficiency enhancement of a detection material is proportional to the square of local light intensity). In consideration of a nonlinear effect, when the light intensity density is large, an absorption coefficient may be reduced as the light intensity increases, and a saturation phenomenon of light absorption occurs. In this case, with the plasmonic nanonail with a high Q value (the Q value reflects a capacity of storing energy inside a resonance cavity) localizes more incident light nearby a nanoparticle, and when the plasmonic nanonail is close to an absorption layer of the detector, the quantum efficiency of the detector material is effectively enhanced.

Second, the absorption peak arising from the localized surface plasmon resonance of metal nanoparticle is very sensitive to a variation of a refractive index of a surrounding medium, and a nanoparticle having a longer morphology and sharper corners indicates much higher response sensitivity to the variation of the refractive index of the medium. After a metal nanomaterial is added to the infrared photodetector, due to a photoluminescence enhancement effect of the metal nanomaterial and its high sensitivity response to a change of a refractive index thereof, a variation of the refractive index can be reflected more easily through changes in an light emission spectrum and a color.

Third, by utilizing a specific plasmon-induced hot carrier of a heterojunction formed by a nanonail formed from metal and a semiconductor, a photon energy detection limit of a conventional semiconductor detector can be broken through, and a detection wavelength range of the conventional semiconductor detector can be broadened.

Fourth, by utilizing polarization selectivity of the nanonail on a direction of incident light, each detection unit has 2-8 different arrangement directions and nanonail structures of 2-4 different sizes. A top electrode and a bottom electrode corresponding to nanonail structures with the same arrangement direction are connected to each other, to independently read out different polarized-light response currents. A top electrode and a bottom electrode corresponding to nanonail structures with the same size are connected to each other, to broaden different response bands.

The present invention is further described below by using a specific embodiment and a comparative embodiment.

Embodiment

A detection unit structure of an adjustable hyperspectral detection chip enhanced by a multi-resonance plasmonic mechanism is shown in FIG. 1, including an aluminum electrode 2, an n-type silicon 3, a silicon-dioxide layer 4, a silver nanonail array 5, an electro-optical control material layer 6, an indium tin oxide electrode 7, a periodical voltage control signal 8, and a driving circuit 9. The silver nanonail array 5 is loaded inside the electro-optical control material layer 6. The silver nanonail array 5 is formed by silver nanonails 51 arranged periodically, and the silver nanonail 51 includes two parts: a silver triangular nanoplate 52 and a silver nanorod 53, and the driving circuit 9 is connected to both sides of the control material layer 6.

When light is irradiated on the detection unit, carriers cross the Schottky barrier to form a photocurrent by using a heterojunction between the n-type silicon 3 and the silver nanonail array 5 based on a plasmon-induced hot carrier effect. Voltage control signals 8 with a time period of 50 ms are applied through the driving circuit 9 to both sides of the electro-optical control material layer 6, to change a distribution state of the electro-optical control material layer 6, thereby changing a refractive index of the medium surrounding the silver nanonail array 5, and scanning a central wavelength of ultra-narrow band absorption of light by the silver nanonail. Output signals of the indium tin oxide electrode 7 and the aluminum electrode 2 of the detector array are collected every 0.5-5 ms in the same period for imaging, thereby implementing a hyperspectral imaging function. By utilizing polarization selectivity of the silver nanonail 51 on a direction of incident light, each detection unit has 2 different arrangement directions and nanonail structures of 2 different sizes. The indium tin oxide electrode 7 is connected to the aluminum electrode 2 corresponding to a nanonail structure with the same arrangement direction, to independently read out different polarized-light response currents. The indium tin oxide electrode 7 is connected to the aluminum electrode 2 corresponding to a nanonail structure with the same size, to broaden different response bands. In addition, sizes of the silver nanonails 51 are all less than the detection wavelength, so that a diffraction limit breakthrough detection function can be implemented.

The above are only preferred implementations of the present invention, and the protection scope of the present invention is not limited to the above implementations. However, all equivalent modifications or changes made by a person of ordinary skill in the art based on the disclosure of the present invention should be included within the protection scope disclosed in the claims.

What is claimed is:

1. An adjustable hyperspectral detection chip enhanced by a multi-resonance plasmonic mechanism, comprising:
    an array of metal nanonail resonance cavity detection units,
    wherein each detection unit comprises: a bottom electrode, a semiconductor material layer, a spacer layer, a nanonail array, a control material layer, a top electrode, and a driving circuit; and the positional relationship from top to bottom is the top electrode, the control material layer, the nanonail array, the spacer layer, the semiconductor material layer, the bottom electrode,
    wherein the nanonail array is loaded inside the control material layer, the driving circuit is connected both sides of the control material layer, and a peripheral control signal is applied to both sides of the control material layer through the driving circuit,
    wherein the nanonail array is formed by plasmonic nanonails with a multi-resonance enhancement effect arranged periodically, and each of the plasmonic nanonails with the multi-resonance enhancement effect comprises two parts: a triangular nanoplate and a nanorod,
    wherein through a localized surface plasmon resonance peak formed by the triangular nanoplate and a plasmonic Fabry-Perot resonance peak formed by the nanorod at the same wavelength, the plasmonic nanonails with the multi-resonance enhancement effect have characteristics of infrared ultra-narrow band absorption, strong short-range dielectric sensitivity and strong polarization selectivity; that is, the plasmonic multi-resonance enhancement effect exists.

2. The adjustable hyperspectral detection chip enhanced by the multi-resonance plasmonic mechanism according to claim 1, wherein a size of the detection unit ranges from 200 nanometers to 4 microns, a distance between adjacent detection units ranges from 500 nanometers to 2 microns, the array of detection units is a k×t two-dimensional area array, wherein values of k and t are set to 2-10000, and a size of the detection chip formed by the detection units ranges from 100-5000 microns.

3. The adjustable hyperspectral detection chip enhanced by the multi-resonance plasmonic mechanism according to claim 1, wherein the bottom electrode is a multi-layer electrode, layers of electrodes are insulated from each other, and each layer of electrode cooperates with the top electrode to independently read out an electrical signal.

4. The adjustable hyperspectral detection chip enhanced by the multi-resonance plasmonic mechanism according to claim 1, wherein the bottom electrode and the top electrode are transparent materials and have a thickness of 50 nanometers to 300 nanometers; materials for the bottom electrode and the top electrode are selected from gold, silver, copper, aluminum, titanium, a nickel metal electrode material or indium tin oxide (ITO), aluminum-doped zinc oxide (AZO), fluorine-doped tin oxide (FTO), and a graphene semiconductor transparent conductive material; and a number of layers of the bottom electrode is m+n, wherein a value of m is set to a number of arrangement directions of nanonails in the detection unit, and a value of n is set to a number of size types of the nanonails in the same detection unit.

5. The adjustable hyperspectral detection chip enhanced by the multi-resonance plasmonic mechanism according to claim 1, wherein a material for the semiconductor material layer is selected from n-type silicon, n-type gallium arsenide, indium phosphide (InP), gallium antimonide (GaSb), or cadmium zinc telluride (CdZnTe), and a thickness of the semiconductor material layer ranges from 1 micron to 500 microns.

6. The adjustable hyperspectral detection chip enhanced by the multi-resonance plasmonic mechanism according to claim 1, wherein a material of the spacer layer comprises silicon dioxide or aluminum oxide.

7. The adjustable hyperspectral detection chip enhanced by the multi-resonance plasmonic mechanism according to claim 1, wherein the nanonail array comprises 2-10 plasmonic nanonails with the multi-resonance enhancement effect, a size of the nanonail ranges from 20 nanometers to 1000 nanometers, and a spacing between the nanonails ranges from 10 nanometers to 1000 nanometers.

8. The adjustable hyperspectral detection chip enhanced by the multi-resonance plasmonic mechanism according to claim 7, wherein a material for the plasmonic nanonail with the multi-resonance enhancement effect is selected from gold, silver, copper, palladium, rhodium, or semiconductor alloy plasmonic materials.

9. The adjustable hyperspectral detection chip enhanced by the multi-resonance plasmonic mechanism according to claim 1, wherein a material for the plasmonic nanonail with the multi-resonance enhancement effect is selected from gold, silver, copper, palladium, rhodium, or semiconductor alloy plasmonic materials.

10. The adjustable hyperspectral detection chip enhanced by the multi-resonance plasmonic mechanism according to claim 1, wherein the control material layer is an electro-optical material, an acousto-optic material, a piezo-optic material, or a material with an adjustable refractive index.

* * * * *